United States Patent
Takahashi et al.

(10) Patent No.: US 6,864,708 B2
(45) Date of Patent: Mar. 8, 2005

(54) SUPPRESSING THE LEAKAGE CURRENT IN AN INTEGRATED CIRCUIT

(75) Inventors: Hiroshi Takahashi, Ibaraki (JP);
Akihiro Takegama, Ibaraki (JP);
Yutaka Toyonoh, Ibaraki (JP); Kaoru Awaka, Ibaraki (JP); Tsuyoshi Tanaka, Ibaraki (JP); Rimon Ikeno, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 331 days.

(21) Appl. No.: 10/200,719

(22) Filed: Jul. 22, 2002

(65) Prior Publication Data

US 2003/0025130 A1 Feb. 6, 2003

(30) Foreign Application Priority Data

Jul. 25, 2001 (JP) ........................................ 2001-225043

(51) Int. Cl.[7] ............................................ H03K 19/003
(52) U.S. Cl. .............................. 326/33; 326/34; 327/544
(58) Field of Search .............................. 326/33–34, 31; 327/544, 535

(56) References Cited

U.S. PATENT DOCUMENTS 5,408,144 A * 4/1995 Sakata et al. ................. 326/21
5,973,552 A * 10/1999 Allan ........................... 327/544
6,483,165 B2 * 11/2002 Ooishi et al. ................ 257/499

FOREIGN PATENT DOCUMENTS

| JP | 09-073873 | 3/1997 |
|----|-----------|--------|
| JP | 10-270993 | 10/1998 |

* cited by examiner

*Primary Examiner*—James H. Cho
(74) *Attorney, Agent, or Firm*—J. Dennis Moore; W. James Brady, III; Frederick J. Telecky, Jr.

(57) ABSTRACT

A semiconductor integrated circuit wherein the circuit area can be minimized, and defects can be detected reliably during a standby status while maintaining the reliability of a gate oxide film. Switching circuit 20 is provided between logic circuit 10 and source voltage $V_{dd}$ supply terminal. While in an operating status, 0 V voltage is applied to the gate of transistor MP0 of switching circuit 20, and bias voltage $V_B$ equal to or slightly lower than source voltage $V_{dd}$ is applied to its channel region in order to reduce the threshold voltage of transistor MP0 and increase its current driving capability. While in a standby status, a voltage equal to source voltage $V_{dd}$ is applied to the gate of transistor MP0, a voltage lower than the source voltage is applied to the source, and bulk bias voltage $V_B$ equal to or higher than source voltage $V_{dd}$ is applied to the channel region in order to minimize the drain current of transistor MP0, so that current path of logic circuit 10 is cut off, and the occurrence of leakage current is suppressed.

8 Claims, 7 Drawing Sheets

|  | NWPS Vdd=1.05V | NTPS Vdd=0.95V | STRONG Vdd=0.85V |
|---|---|---|---|
| P-MOS | NWPT Vdd=1.15V | TYPICAL Vdd=1.05V | NSPT Vdd=0.95V |
|  | WEAK Vdd=1.2V | NTPW Vdd=1.15V | NSPW Vdd=1.05V |

STRONG CORNER (top right), WEAK CORNER (bottom left), N-MOS (bottom axis)

FIG. 14

| ACTIVE MODE | BIT 2 | BIT 1 | BIT 0 | Vdd1 SW Tr SOURCE (TVDD) | Vdd2 SW Tr GATE | Vdd3 WAKE UP LOGIC | PROCESS REQUIREMENT |
|---|---|---|---|---|---|---|---|
| FUSE PROG-0 | 0 | 0 | 0 | 1.20V | 1.20V | 1.20V | WEAK |
| FUSE PROG-1 | 0 | 0 | 1 | 1.15V | 1.15V | 1.15V | NTPW,NWPT |
| FUSE PROG-2 | 0 | 1 | 0 | 1.05V | 1.05V | 1.05V | TYPC,NSPW,NWPS |
| FUSE PROG-3 | 0 | 1 | 1 | 0.95V | 0.95V | 0.95V | NSPT,NTPS |
| FUSE PROG-4 | 1 | 0 | 0 | 0.85V | 0.85V | 0.85V | STRONG |

FIG. 15

| SLEEP MODE | BIT 2 | BIT 1 | BIT 0 | Vdd1 SW Tr SOURCE (TVDD) | Vdd2 SW Tr GATE | Vdd3 WAKE UP LOGIC | PROCESS REQUIREMENT |
|---|---|---|---|---|---|---|---|
| FUSE PROG-0 | 0 | 0 | 0 | 0.7V | 1.0V | 0.7V | WEAK |
| FUSE PROG-1 | 0 | 0 | 1 | 0.7V | 1.0V | 0.7V | NTPW,NWPT |
| FUSE PROG-2 | 0 | 1 | 0 | 0.7V | 1.0V | 0.7V | TYPC,NSPW,NWPS |
| FUSE PROG-3 | 0 | 1 | 1 | 0.7V | 1.0V | 0.7V | NSPT,NTPS |
| FUSE PROG-4 | 1 | 0 | 0 | 0.7V | 1.0V | 0.7V | STRONG |

SUPPRESSING THE LEAKAGE CURRENT IN AN INTEGRATED CIRCUIT

FIELD OF THE INVENTION

The present invention pertains to a semiconductor integrated circuit, for example, a semiconductor integrated circuit by which power consumption can be reduced by suppressing leakage current.

BACKGROUND OF THE INVENTION

In recent years, as semiconductor integrated circuit technology has progressed, mobile communication terminals, compact solid-state audio players, and portable semiconductor devices, such as laptop personal computers, have become pervasive. Since a necessary power is supplied to these semiconductor devices, it is absolutely essential to reduce the power consumption in order to allow them to operate for a long time.

In the case of a semiconductor integrated circuit, voltage reduction is one effective method for achieving low power consumption. Thus, semiconductor integrated circuits having a source voltage of 1.0 V or lower have been prototyped and have already been brought to the commercial stage. When the source voltage drops and becomes close to threshold voltage $V_{th}$ of a MOS transistor, a drop in its operating speed becomes a problem. In order to maintain the operating speed of a semiconductor integrated circuit with a low source voltage, a transistor with a threshold voltage lower than that of a normal transistor is needed. However, along with a decrease in the threshold voltage of the transistor is an increase in leakage current results. Thus, while in a standby status, that is, when not operating, the increase in power consumption due to leakage current reaches a level which cannot be ignored, so that reduction of power consumption, the primary objective of reducing the voltage, can no longer be realized.

Figure 18:
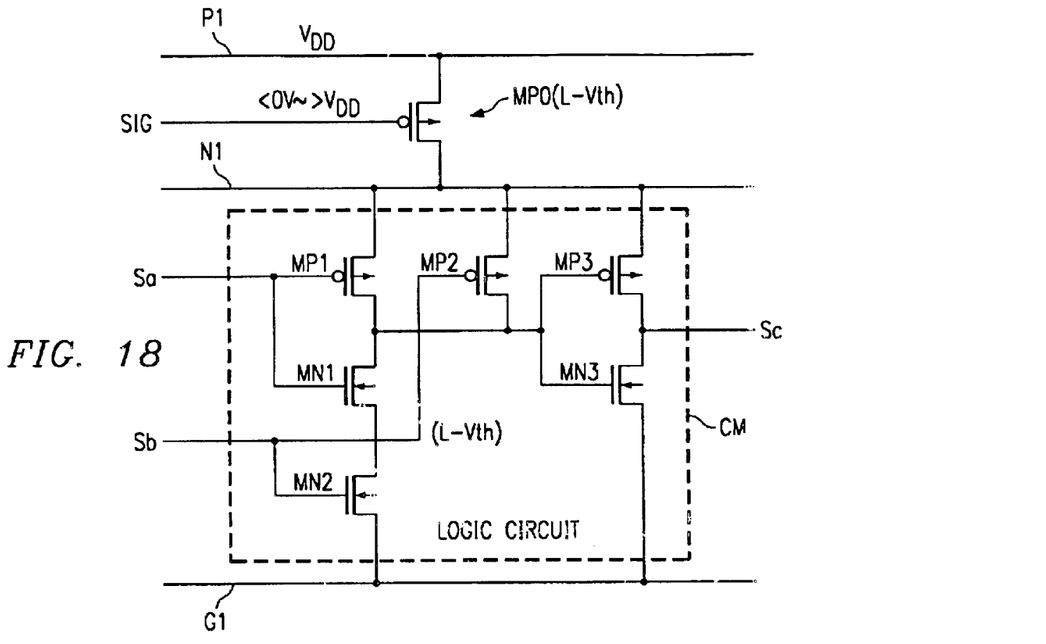
FIG. 18 is a circuit diagram showing an example of a semiconductor integrated circuit used to reduce the leakage current during standby.

Various technologies have been suggested in order to reduce the leakage current during standby status. One such example is shown in FIG. 18. In said technology, a pMOS transistor with a low threshold voltage is provided in the current supply path of a functional circuit configured with a MOS transistor with a low threshold voltage, for example, a logic circuit which performs a prescribed logic operation, and a voltage higher than the source voltage is applied to the gate of said transistor during standby status to cut off the current path by clearly bringing said transistor to an OFF status in order to reduce the leakage current of the low threshold voltage transistor. Thus, the transistor to be inserted in the current path is also referred to as a cut-off transistor. In addition, said clear OFF status is referred to as a super cut-off status.

As shown in FIG. 18, logic circuit CM is configured with pMOS transistors MP1, MP2, and MP3 and NMOS transistors MN1, MN2, and MN3. These MOS transistors are low threshold voltage transistors having a threshold voltage lower than the threshold voltage of a normal transistor. For example, threshold voltage $V_{thp}$ of the pMOS transistors is −0.2 V or so, and threshold voltage $V_{thn}$ of the NMOS transistors is 0.2 V or so.

Logic circuit CM is connected between node N1 serving as a virtual power supply terminal and ground line G1. It performs a prescribed logic operation upon receiving input signals Sa and Sb and outputs operation result Sc.

Cut-off transistor MP0 is a pMOS transistor in which the source is connected to supply line P1 for source voltage $V_{DD}$, and the drain is connected to node N1. The absolute value of the threshold voltage of transistor MP0 is equal to the threshold voltage of pMOS transistors MP1 through MP3 constituting logic circuit CM.

Control signal SIG is applied to the gate of transistor MP0. Control signal SIG is maintained at a low level, for example, a voltage equal to ground potential GND, during operation, and control signal SIG is maintained at a high level, for example, a voltage higher than source voltage $V_{DD}$, during standby status. For example, source voltage $V_{DD}$ is equal to the minimum voltage, for example, 0.5 V, for logic circuit CM to operate. Assume that control signal SIG is maintained at ground potential GND, that is, 0.0 V during operation, and control signal SIG is maintained at 1.0 V during standby.

Thus, gate-source voltage $V_{gs}$ of transistor MP0 becomes 0 V−0.5 V=−0.5 V during operation, and its absolute value becomes greater than the absolute value of threshold voltage −0.2 V of transistor MP0. Thus, transistor MP0 becomes conductive, so that sufficient current supply to logic circuit CM can be secured with low voltage during operation.

On the other hand, gate-source voltage $V_{gs}$ of transistor MP0 becomes 1.0 V−0.5 V=0.5 V during standby. Thus, transistor MP0 having the threshold voltage of −0.2 V enters super cut-off status. Because a gate voltage which makes transistor MP0 enter the super cut-off status is applied, leakage current during standby can be suppressed, so that power consumption can be reduced.

Figure 19:
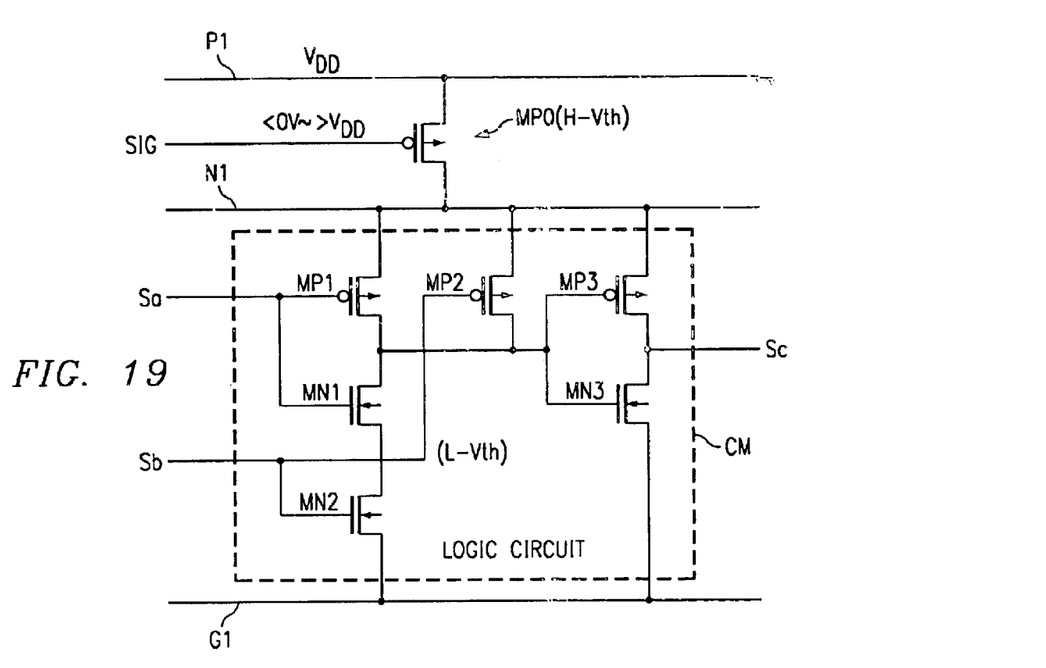
FIG. 19 is a circuit diagram showing another example of the configuration of a semiconductor integrated circuit used to reduce the leakage current during standby.

In addition, in another technology, as shown in FIG. 19, for example, pMOS transistor having threshold voltage $V_{thp}$ higher than the absolute value of the threshold voltage of a normal pMOS transistor, for example, a transistor with $V_{thp}=-0.7$ V when the threshold voltage of a normal pMOS transistor is −0.5 V, is used for MP0; and control signal SIG lower than the ground voltage, for example, SIG=−0.8V, is applied to the gate of transistor MP0 during operation in order to achieve the same effect as that mentioned above.

In the case of the aforementioned technology in which the leakage current path is cut off using a cut-off transistor during operation, it is difficult to assure the reliability of the gate oxide film in the cut-off transistor. For example, in the aforementioned example in FIG. 18, the drain of transistor MP3 is at a low level when output signal Sc from an inverter comprising transistors MP3 and MN3 is at a low level during operation. The potential of its source, that is, node N1, soon drops to a low level, for example, 0 V, due to the leakage current of transistor MP3. At this time, because the drain is 0 V, and high-voltage control signal SIG, for example, source voltage $V_{DD}+0.5$ V, is applied to the gate in cut-off transistor MP0, a voltage difference of source voltage $V_{DD}+0.5$ V is created between the gate and the drain of transistor MP0. In such case, the gate oxide film is subjected to stress during standby, and it is difficult to assure its reliability.

In addition, in the case of the aforementioned example in FIG. 19, the voltage applied to the gate of MP0 becomes $V_{DD}+0.8V$ during operation, so that it is difficult to assure the reliability of the gate oxide film.

It has also been suggested to configure the cut-off transistor using cascade-connected 2-stage transistors, for example, in order to assure the reliability of the gate oxide film. In this case, although the voltage applied to the gate oxide film during standby may be dispersed in a number of transistor stages in order to improve the reliability of the gate oxide film, the circuit area becomes larger in accordance with the number of cut-off transistors. Furthermore, the current supplied to the circuit is suppressed by resistance created as the cascade-connected transistors are turned on, resulting in a significant drop in the circuit speed.

In addition, there is no effective $I_{ddq}$ testing method for detecting manufacturing defects for the aforementioned technologies. For example, when the cut-off transistor is on, the current cannot be identified as a current caused by a high-performance transistor with a high leakage current or a low threshold voltage transistor or a leakage current due to a defect. Thus, product inspection takes time and has [high] cost, disadvantages which interfere with mass production.

The present invention was created in light of such a situation, and its objective is to present a semiconductor integrated circuit by which the leakage current during standby can be suppressed while maintaining the reliability of the gate oxide film, the circuit area can be minimized, and defects can be detected reliably.

SUMMARY OF THE INVENTION

In order to achieve the aforementioned objective, a semiconductor integrated circuit of the present invention has a functional circuit which performs prescribed processing, a voltage supply circuit which supplies a first source voltage or a second source voltage higher than the aforementioned first source voltage according to a source voltage control signal, a transistor which is connected between the voltage supply terminal of the aforementioned voltage supply circuit and the voltage input terminal of the aforementioned functional circuit in order to control the power supplied to the aforementioned functional circuit according to a conduction control signal applied to its gate terminal, and a control circuit which supplies the aforementioned source voltage control signal and the aforementioned conductivity control signal; wherein, the aforementioned voltage supply circuit supplies the aforementioned first source voltage while the aforementioned functional circuit is in a standby status, and it supplies the aforementioned second source voltage while the aforementioned functional circuit is operating.

In addition, in the present invention, preferably, the aforementioned transistor is configured with a pMOS transistor, and the voltage level of the aforementioned conductivity control signal is higher than the source voltage of the aforementioned first source voltage when the aforementioned functional circuit is in the standby status.

In addition, in the present invention, preferably, a bias voltage applied to the channel region of the aforementioned transistor is equal to the aforementioned first source voltage or higher than the aforementioned first source voltage when the aforementioned functional circuit is in the standby status, and the aforementioned bias voltage is equal to the aforementioned second source voltage or lower than the aforementioned second source voltage when the aforementioned functional circuit is operating.

Furthermore, a semiconductor integrated circuit of the present invention has a functional circuit which performs prescribed processing, a voltage supply circuit which supplies a first source voltage or a second source voltage higher than the aforementioned first source voltage according to a source voltage control signal, a transistor which is connected between the voltage supply terminal of the aforementioned voltage supply circuit and the voltage input terminal of the aforementioned functional circuit in order to control the power supplied to the aforementioned functional circuit according to a conduction control signal applied to its gate terminal, and a control circuit which supplies the aforementioned source voltage control signal and the aforementioned conductivity control signal; wherein, the aforementioned voltage supply circuit supplies the aforementioned second source voltage while the aforementioned functional circuit is in a standby status, and it supplies the aforementioned first source voltage while the aforementioned functional circuit is operating.

In addition, in the present invention, preferably, the aforementioned transistor is configured with an nMOS transistor, and the voltage level of the aforementioned conductivity control signal is lower than the source voltage of the aforementioned second source voltage when the aforementioned functional circuit is in the standby status.

In addition, in the present invention, preferably, a bias voltage applied to the channel region of the aforementioned transistor is equal to the aforementioned second source voltage or lower than the aforementioned second source voltage when the aforementioned functional circuit is in the standby status, and the aforementioned bias voltage is equal to the aforementioned first source voltage or higher than the aforementioned first source voltage when the aforementioned functional circuit is operating.

Furthermore, a semiconductor integrated circuit of the present invention has multiple functional circuits which perform prescribed processing, multiple switching circuits which are connected between the source voltage input terminals and the source voltage supply terminals of the aforementioned functional circuits in correspondence respectively to the aforementioned multiple functional circuits, and scan-pass circuits cascade-connected with multiple latching circuits corresponding respectively to the aforementioned multiple switching circuits; wherein, voltage signals corresponding to the data stored in the aforementioned latching circuits are applied to the control terminals of the aforementioned switching circuits in order to make the aforementioned switching circuits conductive or non-conductive according to said voltage signals.

Furthermore, a semiconductor integrated circuit of the present invention has a functional circuit containing an NMOS transistor and a pMOS transistor which performs prescribed processing, a data generating circuit which generates control data corresponding to the driving capabilities of the transistors in the aforementioned functional circuit, a voltage supply circuit which supplies source voltages of different voltage values according to the aforementioned control data, and a transistor which is connected between the voltage supply terminal of the aforementioned voltage supply circuit and the voltage input terminal of the aforementioned functional circuit in order to supply a voltage to the aforementioned functional circuit according to a conductivity control signal applied to its gate terminal.

In addition, in the present invention, preferably, the aforementioned data generating circuit is provided with a fuse circuit used for setting the aforementioned control data.

REFERENCE NUMERALS AND SYMBOLS AS SHOWN IN THE DRAWINGS

In the figures, 10 represents a logic circuit, 20 represents a switching circuit, 30 represents a control circuit, 40 represents a voltage regulator, 50 represents a source voltage switching circuit, 60 represents a bulk bias switching circuit, 100 represents a voltage regulator, 110, 120, . . . , 180 represents a flip-flop, 200 represents a device, 202 represents a fusing circuit, 210, 220, . . . , 280 represents a functional circuit, 310, 320, . . . , 380 represents a switching circuit, $V_{cc}$, $V_{dd}$ represents a source voltage, and GND represents a ground potential.

DESCRIPTION OF THE EMBODIMENTS

First Embodiment

Figure 1:
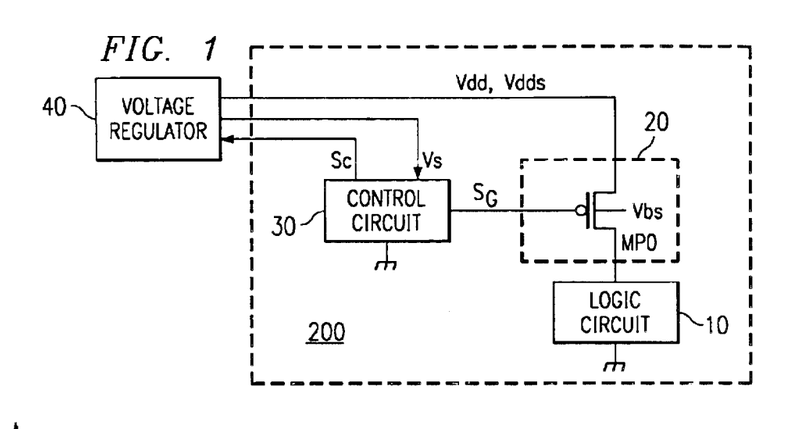
FIG. 1 is a circuit diagram showing the first embodiment of the semiconductor integrated circuit pertaining to the present invention.

FIG. 1 is a circuit diagram showing a first embodiment of a semiconductor integrated circuit pertaining to the present invention.

As shown in the figure, the semiconductor integrated circuit of the present embodiment is configured with logic circuit 10 having a CMOS structure, switching circuit 20 for supplying an operating current to logic circuit 10, voltage regulator 40 capable of supplying variable and multiple voltages, and control circuit 30 for controlling voltage regulator 40.

In the case of the semiconductor integrated circuit of the present embodiment, reduction in the leakage current is realized by taking advantage of the characteristic that when gate-source voltage $V_{gs}$ of a MOS transistor is kept at a specific value, leakage current of said transistor is at the lowest value. Furthermore, the phenomenon that a minimum value is present in the leakage current according to gate-source voltage $V_{gs}$ is referred to as LCV (Leakage Current Valley: valley in the leakage current).

Figure 4:
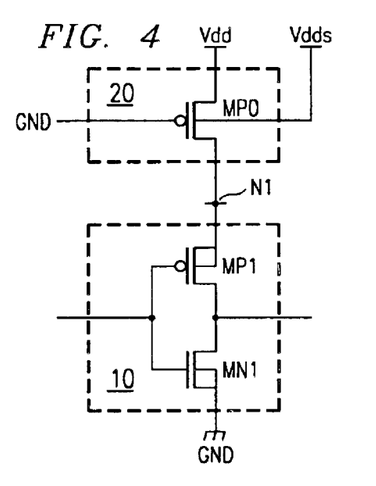
FIG. 4 is a diagram showing the bias condition of the semiconductor integrated circuit of the first embodiment during operation.

As shown in FIG. 4, logic circuit 10 is a CMOS inverter configured with pMOS transistor MP1 and NMOS transistor MN1. Furthermore, logic circuit 10 is not limited to said [configuration], and it may consist of other kinds of logic circuits, such as an AND circuit, a NAND circuit, or an OR circuit. Furthermore, the pMOS transistor and the nMOS transistor constituting logic circuit 10 are so-called low threshold voltage MOS transistors having a threshold voltage, or an absolute value of threshold voltage, lower than that of a normal transistor. For example, while threshold voltage $V_{thp}$ of a normal pMOS transistor is approximately –0.7 V, and threshold voltage $V_{thn}$ of a normal nMOS transistor is approximately 0.7 V, threshold voltage $V_{thp}$ of the pMOS transistor constituting logic circuit 10 is approximately –0.2 V, and threshold voltage $V_{thn}$ of the nMOS transistor is approximately 0.2 V.

In FIG. 1, switching circuit 20 is configured with pMOS transistor MP0. Transistor MP0 has a threshold voltage either equal to or higher than that of the low threshold transistor constituting the logic circuit, and said threshold voltage is –0.2 V, for example.

Switching circuit 20 supplies an operating current to logic circuit 10 during operation and suppresses the leakage current of the low threshold voltage transistor of logic circuit 10 during standby. As shown in FIG. 4, in switching circuit 20, the source of transistor MP0 is connected to source voltage $V_{dd}$ supply line, and its drain is connected to node N1. In other words, node N1 is a virtual source voltage supply terminal of logic circuit 10. When transistor MP0 is conductive (on), source voltage $V_{dd}$ is applied to node N1, and a driving current is supplied to logic circuit 10. On the other hand, when transistor MP0 is off (off), supply of current to logic circuit 10 is cut off. Thus, generation of a leakage current at logic circuit 10 is suppressed.

Control signal $S_G$ of different levels is applied to the gate of transistor MP0 during operation and during standby, respectively. Transistor MP0 is turned on or off according to the level of said control signal $S_G$. Furthermore, different levels are applied during operation and during standby, respectively, for the source voltage at the source of transistor MP0. In the prior art, the source voltage is kept at the same value during operation and during standby. However, in the case of the semiconductor integrated circuit of the present embodiment, source voltages $V_{dd}$ and $V_{dds}$ are switched depending on the condition of logic circuit 10. For example, during operation, source voltage $V_{dd}$ is set to nominal operating voltage $V_{ddN}$ of the transistor. During standby, the source voltage is set to value $V_{ddL}$, for example, $V_{ddL}$=$V_{ddN}$−0.3 V, slightly lower than $V_{ddN}$. As a result, the gate-source voltage of switching transistor MP0 acquires the opposite sign to that of the voltage during normal use in order to realize a super cut-off status.

Figure 2:
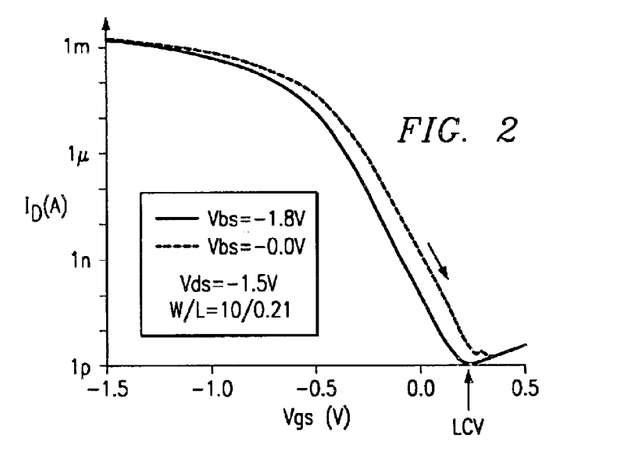
FIG. 2 is a graph showing the current characteristic of the MOS transistor; wherein, the graph shows the LCV of the drain current of the transistor.

FIG. 2 is a graph showing the relationship between drain current $I_D$ of pMOS transistor MP0 and gate-source voltage $V_{gs}$. In said graph, drain-source voltage $V_{ds}$ of transistor MP0 is −1.5V, for example. In addition, assume that channel width W of transistor MP0 is 10 μm, and channel length L is 0.21 μm.

As shown in FIG. 2, the drain current of the transistor changes in accordance with gate-source voltage $V_{gs}$. When gate-source voltage $V_{gs}$ is of a specific value, for example, when $V_{gs}$ is approximately 0.2 V, in FIG. 2, the drain current of transistor MP0 has a very low value. That is, a leakage current valley (LCV) is present. The gate-source voltage at this time will be referred to as $V_{gsV}$ hereinafter.

As described above, drain current $I_D$ of transistor MP0 can be further reduced during standby bringing gate-source voltage $V_{gs}$ up to $V_{gsV}$ by controlling control signal $S_G$ that is applied to the gate of transistor MP0 during standby. Thus, leakage current of logic circuit 10 can be reduced drastically. For example, when $V_{gs}$=$V_{gsV}$, drain current $I_D$ of the transistor is reduced to approximately 1/700 of that when gate-source voltage $V_{gs}$ is 0 V.

Furthermore, the drain current can be further reduced by applying a voltage higher than the voltage applied to the source of transistor MP0 to its channel region during standby.

Figure 3:
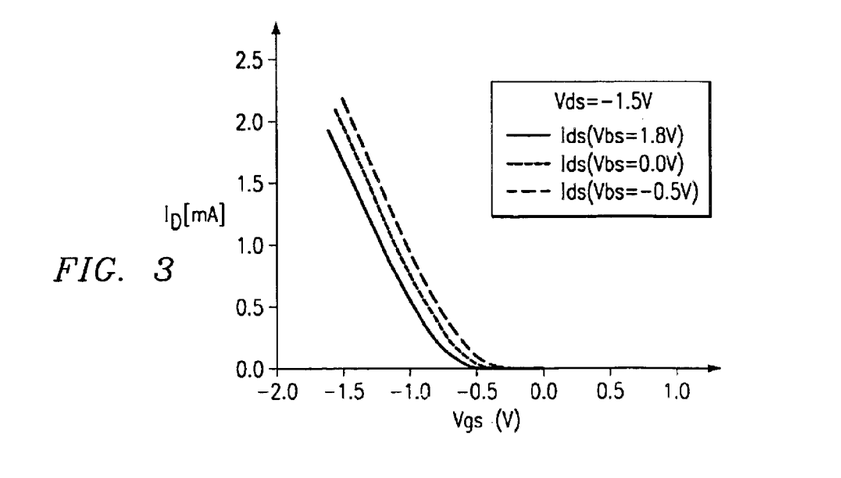
FIG. 3 is a graph showing the relationship between the drain current of the transistor and the bulk bias voltage.

FIG. 3 shows changes in the drain current in accordance with bias voltage $V_{bs}$ (will be referred to as bulk bias voltage, hereinafter) applied to the channel region of the pMOS transistor. In FIG. 3, relationship between drain current $I_D$ and gate-source voltage $V_{gs}$ when bulk bias voltage $V_{bs}$ is −0.5 V, 0 V, and 1.8 V is shown as an example. As shown in the figure, drain [current] $I_D$ is largest when bulk bias voltage $V_{bs}$ is −0.5 V, and drain current $I_D$ is smallest when bulk bias voltage $V_{bs}$ is 1.8 V. That is, when gate-source voltage $V_{gs}$ of the pMOS transistor is constant, the drain current decreases as bulk bias voltage $V_{bs}$ increases. Thus, drain current $I_D$ can be controlled by controlling bulk bias voltage $V_{bs}$ of transistor MP0 during operation and during standby. For example, drain current $I_D$ can be further suppressed in addition to the super cut-off effect by controlling bulk bias voltage $V_{bs}$ to be high.

In addition, gate voltage $S_G$ of transistor MP0 is kept at the same level as the ground potential during operation. Because transistor MP0 is a low threshold voltage transistor, deterioration of the circuit performance during operation can be suppressed. Furthermore, a large operating current can be supplied to logic circuit 10 by applying bulk bias voltage $V_{bs}$ slightly lower than the source voltage to the channel region of transistor MP0, so that the operating speed can be improved.

FIG. 4 is a diagram showing the bias condition of transistor MP0 during operation. As shown in the figure, gate voltage $S_G$ to be applied to the gate of transistor MP0 is kept at ground potential GND during operation, and bias voltage $V_{dds}$ slightly lower than source voltage $V_{dd}$ is applied to its channel region. In addition, during operation, source voltage $V_{dd}$ to be supplied to the source of transistor MP0 is set to nominal operating voltage $V_{ddN}$ of the transistor.

Figure 5:
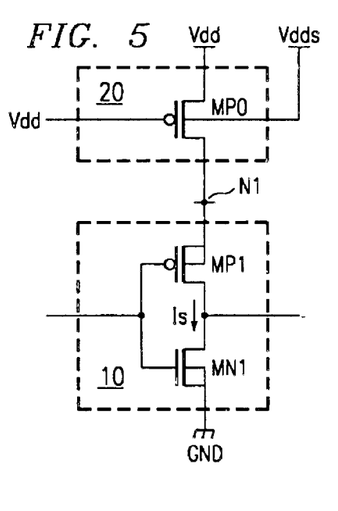
FIG. 5 is a diagram showing the bias condition of the semiconductor integrated circuit of the first embodiment during standby.

FIG. 5 is a diagram showing the bias condition of transistor MP0 during standby. As shown in the figure, source voltage $V_{dd}$ to be supplied to the source of transistor MP0 during standby is set to voltage $V_{ddL}$, for example, $V_{ddL}$=$V_{ddN}$−0.3 V, slightly lower than nominal operating voltage $V_{ddN}$. Under said condition, transistor MP0 is in the super-cut-off status, so that drain current $I_D$ can be further reduced by applying voltage $V_b$ higher than source voltage $V_{ddL}$ to be supplied to the source, that is, $V_b$=$V_{ddL}$+α, to the channel region of transistor MP0.

As explained above, in the present embodiment, control signal $S_G$ with the same voltage as source voltage $V_{ddN}$ during operation is applied to the gate of transistor MP0 during standby, and voltage $V_{ddL}$ lower than said [voltage] is applied to the source in order for transistor MP0 to enter the super cut-off status; its drain current $I_D$ is suppressed to a minimum value by controlling the difference between the voltage applied to the source of transistor MP0 and control signal $S_G$ properly by taking advantage of the so called leakage current valley (LCV), that is, the drain current of the MOS transistor becomes a minimum when gate-source voltage $V_{gs}$ is of a specific value; and the leakage current of logic circuit 10 during standby can be reduced significantly by applying bulk bias voltage $V_B$ higher than said source voltage, for example, I/O source voltage of 3.3 V, to the channel region of transistor MP0; so that the power consumption due to leakage current can be reduced. Furthermore, the operating speed can be improved by applying a bulk bias voltage slightly lower than said source voltage to the channel region of transistor MP0 during operation.

Second Embodiment

Figure 6:
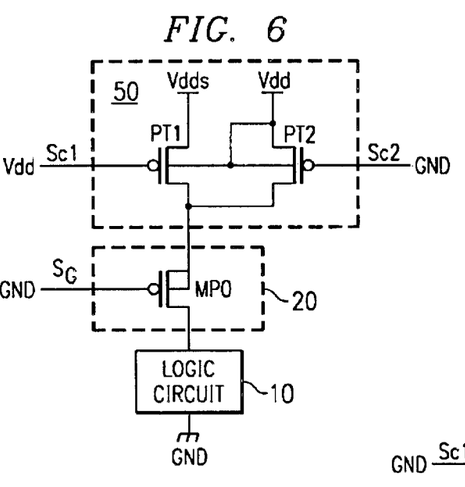
FIG. 6 is a circuit diagram showing the second embodiment of the semiconductor integrated circuit pertaining to the present invention; wherein, the circuit diagram shows the bias condition during operation.

FIG. 6 is a circuit diagram showing a second embodiment of the semiconductor integrated circuit pertaining to the present invention.

As shown in the figure, the semiconductor integrated circuit of the present embodiment is configured with source voltage switching circuit 50 provided in place of the voltage regulator. Source voltage switching circuit 50 switches the level of the source voltage supplied to switching circuit 20 during operation and during standby.

In the aforementioned first embodiment of the semiconductor integrated circuit, the source voltage supplied to switching circuit 20 is switched using voltage regulator 40. The source voltage level needs to be switched quickly according to the operating condition of the semiconductor integrated circuit. For example, when switched from the standby status to the operating status, responsiveness of logic circuit 10 is affected unless the source voltage to be supplied to switching circuit 20 is switched from $V_{dds}$ to $V_{dd}$ within several clock cycles.

If voltage regulator 40 cannot meet the requirement of high-speed source voltage switching, source voltage switching circuit 50 is provided in order to switch the source voltage supplied to switching circuit 20 quickly as shown in the present embodiment.

As shown in FIG. 6, source voltage switching circuit 50 is configured with pMOS transistors PT1 and PT2. Source of transistor PT1 is connected to source voltage $V_{dds}$ supply terminal, and its drain is connected to the source of transistor MP0. Source of transistor PT2 is connected to source voltage $V_{dd}$ supply terminal, and its drain is connected to the source of transistor MP0. Channel regions of transistors PT1 and PT2 are both connected to source voltage $V_{dd}$ supply terminal.

Control signal $S_{c1}$ is applied to the gate of transistor PT1, and control signal $S_{c2}$ is applied to the gate of transistor PT2. Thus, transistors PT1 and PT2 are controlled to be turned on/off according to control signals $S_{c1}$ and $S_{c2}$.

When transistor PT1 is on, transistor PT2 is off; and source voltage $V_{dds}$ is input into the source of transistor MP0 constituting switching circuit 20. On the other hand, when transistor PT2 is on, transistor PT1 is off; and source voltage $V_{dd}$ is input into the source of transistor MP0. Source voltages $V_{dds}$ and $V_{dd}$ are set to $V_{ddL}$ and $V_{ddN}$, respectively.

As described above, in the semiconductor integrated circuit of the present embodiment, the level of the source voltage supplied to switching circuit 20 can be switched quickly by controlling control signals $S_{c1}$ and $S_{c2}$ to be input into source voltage switching circuit 50.

FIG. 6 shows the conditions of control signals $S_{c1}$ and $S_{c2}$ input into source voltage switching circuit 50 during operation. As shown in the figure, in this case, control signal $S_{c1}$ is kept at the level of source voltage $V_{ddN}$, and control signal $S_{c2}$ is kept at ground potential GND, that is, 0 V. Under said condition, because transistor PT1 of source voltage switching circuit 50 is turned off, and transistor PT2 is turned on, source voltage $V_{ddN}$ is input into the source of transistor MP0 via transistor PT2. Furthermore, because control signal $S_G$ of 0 V is applied to the gate of transistor MP0 during operation, transistor MP0 is turned on, and a driving current is supplied to logic circuit 10.

Figure 7:
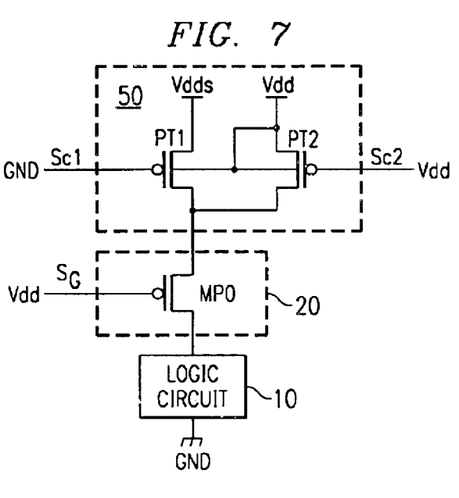
FIG. 7 is a circuit diagram showing the bias condition of the semiconductor integrated circuit of the second embodiment during standby.

FIG. 7 shows the conditions of control signals $S_{c1}$ and $S_{c2}$ input into source voltage switching circuit 50 during standby. As shown in the figure, in this case, control signal $S_{c2}$ is kept at the level of source voltage $V_{ddN}$, and control signal $S_{c1}$ is kept at 0 V. Under said condition, because transistor PT1 of source voltage switching circuit 50 is turned on, and transistor PT2 is turned off, source voltage $V_{ddL}$ is input into the source of transistor MP0 via transistor PT1. Furthermore, because source voltage $V_{ddN}$ level control signal $S_G$ is applied to the gate of transistor MP0 during standby, transistor MP0 is turned off. At this time, gate-source voltage $V_{gs}$ of transistor MP0 is $(V_{ddN}-V_{ddL})$. For example, assuming that $V_{ddN}$ is 1.2 V, and $V_{ddL}$ is 0.9V, $V_{gs}$ becomes 0.3 V. Because this is sufficiently higher than threshold voltage $V_{thp}$ (for example, −0.2 V) of transistor MP0, transistor MP0 is in a super cut-off status, so that the path for the leakage current of logic circuit 10 is cut off to suppress the occurrence of leakage current.

As explained above, in the present embodiment, source voltage switching circuit 50 is provided in order to switch the source voltage supplied to switching circuit 20. Source voltage switching circuit 50 is configured with pMOS transistors PT1 and PT2, and the on/off statuses of transistors PT1 and PT2 are switched according to control signals $S_{c1}$ and $S_{c2}$. Source voltage $V_{ddN}$ is input into switching circuit 20 during operation, and driving current is supplied to logic circuit 10 via switching circuit 20. Voltage $V_{ddL}$ lower than source voltage $V_{ddN}$ is supplied to switching circuit 20 during standby, and switching circuit 20 is cut off in order to cut off the leakage current path, so that the occurrence of leakage current to logic circuit 10 can be suppressed.

Third Embodiment

Figure 8:
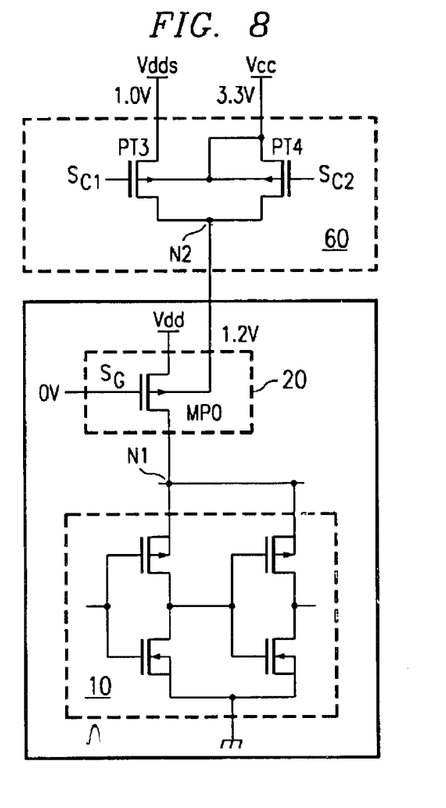
FIG. 8 is a circuit diagram showing the third embodiment of the semiconductor integrated circuit pertaining to the present invention; wherein, the circuit diagram shows the bias condition during operation.

FIG. 8 is a circuit diagram showing a third embodiment of a semiconductor integrated circuit pertaining to the present invention.

As shown in the figure, in the semiconductor integrated circuit of the present embodiment, bulk bias switching circuit 60 is provided; wherein, bulk bias voltage $V_B$ is switched and applied to the channel region of pMOS transistor MP0 constituting switching circuit 20.

Logic circuit 10 is a functional circuit for performing a logic operation. Furthermore, although an example of logic circuit 10 configured with a 2-stage MOS inverter is shown in FIG. 8 for the sake of convenience, logic circuit 10 is not limited to said [example].

Switching circuit 20 is configured with pMOS transistor MP0. The source of transistor MP0 is connected to source voltage $V_{dd}$ supply terminal, and its drain is connected to node N1. Furthermore, node N1 is a virtual source voltage supply terminal of logic circuit 10. Control signal $S_G$ is applied to the gate of transistor MP0. Control signal $S_G$ is kept at 0 V during operation, and control signal $S_G$ is kept at the same level as that of source voltage $V_{ddN}$, for example, 1.2 V, during standby. In addition, the source voltage of MP0 during standby is slightly lower than $V_{ddN}$, for example, $V_{ddL}=V_{ddN}-0.3$ V.

Bulk bias switching circuit 60 is configured with pMOS transistors PT3 and PT4. The source of transistor PT3 is connected to source voltage $V_{ddL}$ supply terminal, and its drain is connected to node N2. The source of transistor PT4 is connected to a terminal for supplying voltage $V_{cc}$ slightly higher than source voltage $V_{ddN}$, and its drain is connected to node N2. Channel regions of transistors PT3 and PT4 are both connected to source voltage $V_{cc}$ supply terminal. Furthermore, control signal $S_{c1}$ is applied to the gate of transistor PT3, and control signal $S_{c2}$ is applied to the gate of transistor PT4.

Here, source voltage $V_{cc}$ is 3.3 V, for example. Furthermore, said source voltage $V_{cc}$ is a source voltage to be supplied to an interface circuit, for example, of a semiconductor integrated circuit. That is, in an actual semiconductor integrated circuit, source voltage $V_{cc}$ is a voltage to be supplied to the core circuit of an interface circuit which requires a higher source voltage. Thus, in the semiconductor integrated circuit of the present embodiment, existing source voltage $V_{cc}$ of 3.3 V may be utilized, and there is no need to generate the 3.3 V high voltage using a booster circuit.

FIG. 8 shows the bias condition of the semiconductor integrated circuit during operation. As shown in the figure, control signal $S_G$ of 0 V is applied to the gate of transistor MP0 of switching circuit 20. At bulk bias switching circuit 60, 0 V control signal $S_{c1}$ is applied to the gate of transistor PT3, and control signal $S_{c2}$ with the same level as that of source voltage $V_{cc}$, for example, 3.3 V, is applied to the source of transistor PT4. In addition, 1.0 V voltage is applied to the source of transistor PT3.

Under said bias condition, because transistor PT3 is turned on, and transistor PT4 is turned off at bulk bias switching circuit 60, the 1.0 V voltage applied to the source of transistor PT3 is applied to the channel region of transistor MP0. In addition, because 0 V control signal $S_G$ is applied to the gate in transistor MP0, transistor MP0 is turned on. As a result, driving current is supplied to logic circuit 10 via transistor MP0.

Figure 9:
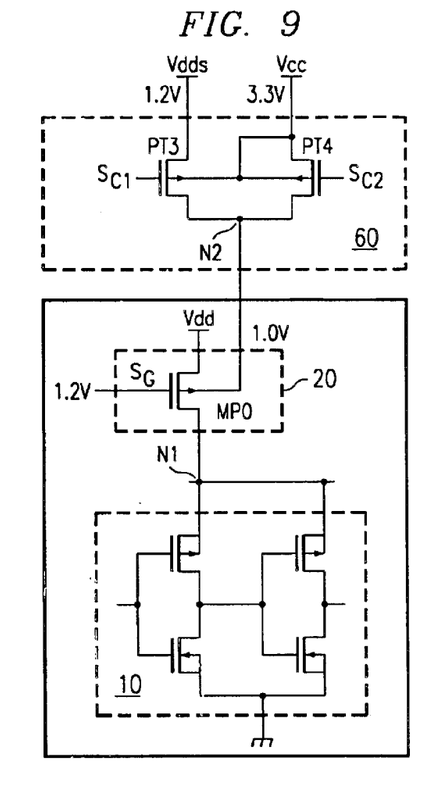
FIG. 9 is a circuit diagram showing the bias condition of the semiconductor integrated circuit of the third embodiment during standby.

FIG. 9 shows the bias condition of the semiconductor integrated circuit during standby. As shown in the figure, control signal $S_G$ with source voltage $V_{dd}$ level, for example, 1.2 V, is applied to the gate of transistor MP0 of switching circuit 20 during standby. At bulk bias switching circuit 60, control signal $S_{c1}$ with source voltage $V_{dd}$ level, for example, 1.2 V, is applied to the gate of transistor PT3, and 0 V control signal $S_{c2}$ is applied to the gate of transistor PT4. In addition, 1.2 V voltage is applied to the source of transistor PT3.

Under said bias condition, because transistor PT3 is turned off, and transistor PT4 is turned on at bulk bias switching circuit 60, the 3.3 V voltage applied to the source of transistor PT4 is applied to the channel region of transistor MP0. In addition, because control signal $S_G$ with source voltage $V_{dd}$ level, for example, 1.2 V, is applied to the gate, and 1.0 V voltage is applied to the source at transistor MP0, transistor MP0 enters a super cut-off status. As a result, leakage current at logic circuit 10 during standby is cut off, so that the power consumption due to leakage current can be reduced.

$I_{ddq}$ Measuring Circuit

Figure 10:
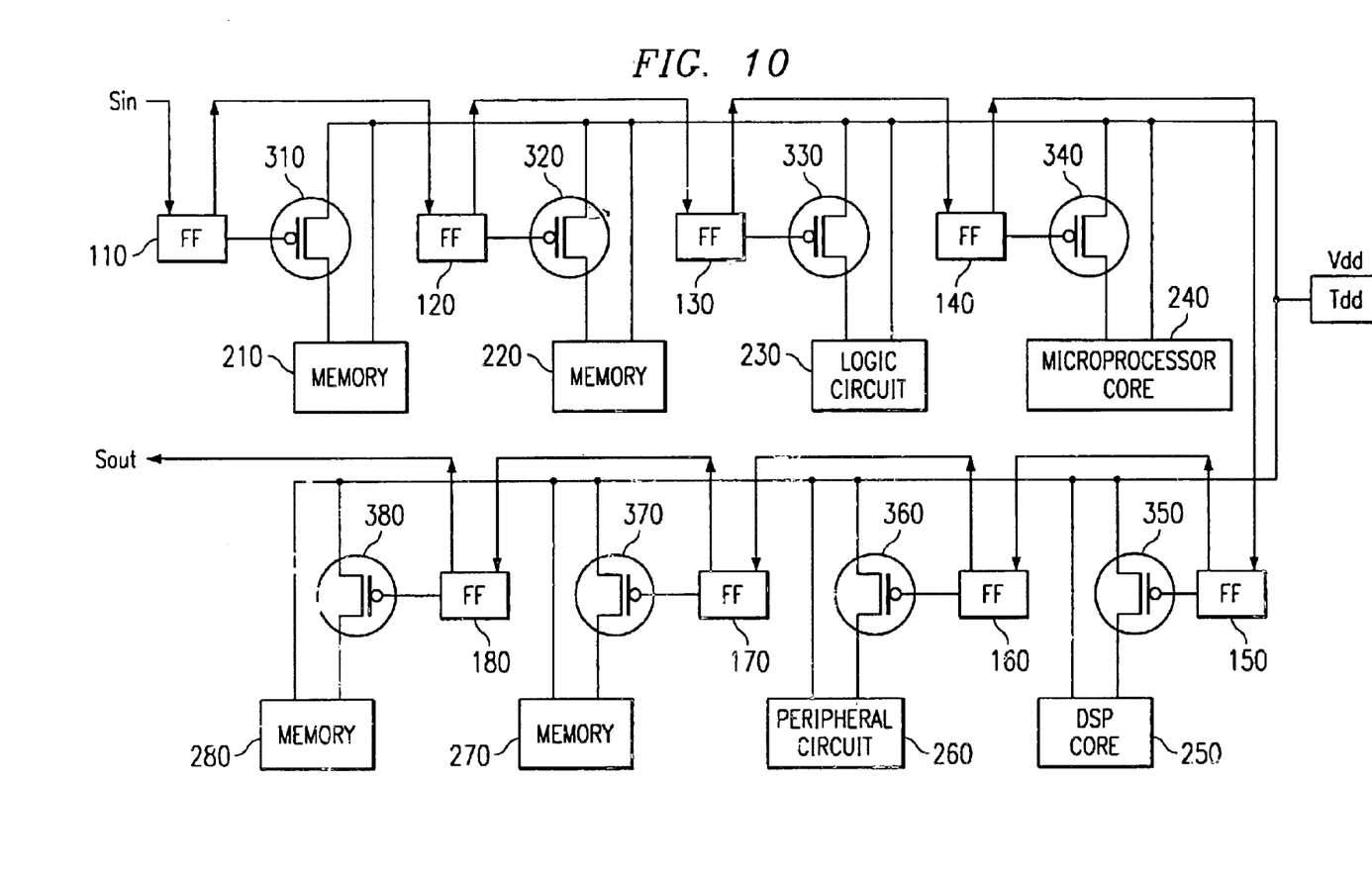
FIG. 10 is a circuit diagram showing an example of the circuit used for the $I_{ddq}$ test of the semiconductor integrated circuit of the present invention.

FIG. 10 shows an example of a circuit capable of performing $I_{ddq}$ measurement. As shown in the figure, said measuring circuit is configured with local circuits, such as a scan-pass circuit comprising multiple flip-flops (FF), memories, a logic circuit, and a peripheral circuit, and a switching circuit for supplying a driving current to each respective local circuit.

As shown in the figure, in said measuring circuit, the scan-pass circuit is configured with flip-flops 110, 120, ..., and 180. Test data $S_{in}$ input is transferred to the output side one after another by said scan-pass circuit.

Memories 210, 220, 270, and 280, logic circuit 230, microprocessor core 240, DSP core 250, and peripheral circuit 260 are functional circuits to be operated using source voltage $V_{dd}$.

The switching circuit is configured with pMOS transistors 310, 320, ..., and 380. These transistors are turned on/off according to the data held in respective flip-flops 110, 120, ..., and 180 in order to supply a driving current to a prescribed functional circuit when in the on status. Because the current supply path to said functional circuit is cut off when in the on status, occurrence of a leakage current in the functional circuit can be suppressed.

In the measuring circuit with the aforementioned configuration, on/off status of respective transistors 310, 320, ..., and 380 can be controlled individually by designing a pattern (will be referred simply to as test pattern, hereinafter) of test data input into the scan-pass circuit appropriately. Thus, supply of driving current to the respective functional circuits can be controlled individually, and $I_{ddq}$ measurement can be performed for the respective functional circuits.

For example, when the test pattern is designed appropriately, data [logic] 0 is stored into flipflop 130, and data [logic] 1 is stored into all the other flip-flops. Under said condition, transistor 330 is on, and the other transistors are all off. Thus, driving current is supplied to logic circuit 230, and logic circuit 230 becomes operational. On the other hand, because no driving current is supplied to any functional circuits other than logic circuit 230, these functional circuits are all in the standby status. Furthermore, in a functional circuit in the standby status, because the transistor constituting the switching circuit is turned off to cut off the leakage current path, occurrence of a leakage current can be suppressed.

At this time, the current supplied from source voltage $V_{dd}$ supply terminal $T_{dd}$ is supplied to logic circuit 230 which is in the operating status. Thus, power consumption of logic circuit 230 during the operation can be measured by measuring the current input from terminal $T_{dd}$.

As described above, in a semiconductor integrated circuit comprising multiple functional circuits, power consumption of the respective functional circuits during the operation can be measured using the measuring circuit of the present example by designing a test pattern to be input into the scan-pass circuit appropriately. In addition, power consumption due to leakage current at each functional circuit during standby can also be measured based on the same principle.

As described above, in the semiconductor integrated circuit shown in FIG. 10, supply of driving current to the respective functional circuits can be controlled individually by controlling the on/off status of the respective transistors constituting the switching circuit using the respective flip-flops of the scan-pass circuit. $I_{ddq}$ of a specific functional circuit can be measured by designing the test pattern input to the scan-pass circuit appropriately.

Fourth Embodiment

Figure 11:
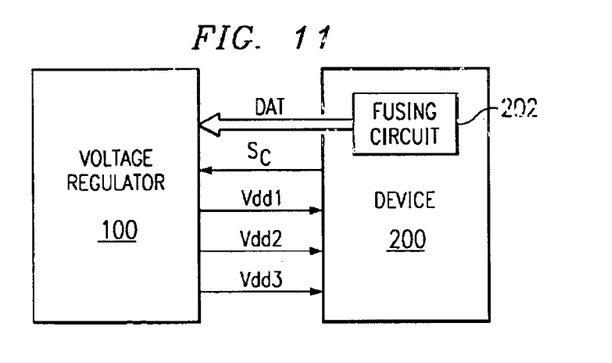
FIG. 11 is a circuit diagram showing the fourth embodiment of the semiconductor integrated circuit pertaining to the present invention.

FIG. 11 is a diagram showing a fourth embodiment of a semiconductor integrated circuit pertaining to the present invention.

As shown in the figure, the semiconductor integrated circuit of the present embodiment is configured with voltage regulator 100 and device 200. Device 200 is provided with fusing circuit 202. Multiple-bit control data DAT are output by said fusing circuit 202. Upon receiving control data DAT from fusing circuit 202, voltage regulator 100 controls the level of voltage to be supplied to device 200 according to said control data and status control signal $S_c$ from device 200. In the case of the example in FIG. 11, multiple different levels of voltages $V_{dd1}$, $V_{dd2}$, and $V_{dd3}$ are supplied from voltage regulator 100 to device 200.

Device 200 is a functional circuit having a prescribed function. Each local circuit of said device 200 is configured with a pMOS transistor and an nMOS transistor, for example. Because the driving capabilities of the pMOS transistor and the NMOS transistor vary due to variations during the production process, operating speed of the overall circuit varies. In order to reduce the effect of said variation, it is effective to control the source voltages to be supplied according to the driving capabilities of the transistors. In other words, when the driving capabilities of the transistors are strong, the levels of the source voltages supplied to device 200 are set low. On the contrary, when the driving capabilities of the transistors are weak, the levels of the source voltages supplied to device 200 are set high.

In the semiconductor integrated circuit of the present embodiment, control data DAT can be set by cutting off a fuse provided in fusing circuit 202 according to the driving capabilities of the pMOS transistor and the nMOS transistor constituting device 200. As a result, voltage regulator 100 can supply source voltages $V_{dd1}$, $V_{dd2}$, and $V_{dd3}$ in accordance with the driving capabilities of the transistors in device 200.

Figure 12:
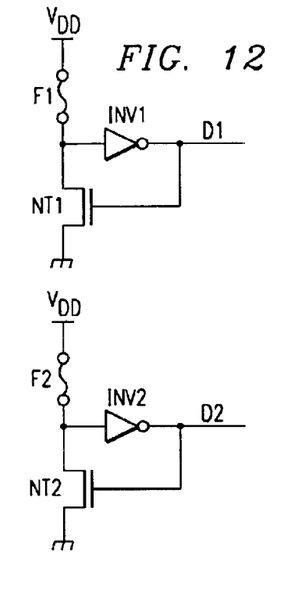
FIG. 12 is a circuit diagram showing an example of the configuration of the fusing circuit.

FIG. 12 is a circuit diagram showing a partial configuration of fusing circuit 202. As shown in the figure, fusing circuit 202 is configured using a set comprising a fuse, an inverter, and an NMOS transistor for each DAT bit. In FIG. 12, a fusing circuit for generating 2-bit control data DAT is shown as an example. As shown in the figure, fusing circuit 202 is configured with a bit D1 generating part comprising fuse F1, inverter INV1, and nMOS transistor NT1 and a bit D2 generating part comprising fuse F2, inverter INV2, and nMOS transistor NT2.

Because input terminal of inverter INV1 is kept at source voltage $V_{dd}$ while fuse F1 is connected, its output terminal is kept at a low level. Thus, transistor NT1 is turned off, and the input terminal of inverter INV1 is kept at a high level. That is, while fuse F1 is connected, bit D1 is kept at the low level. Said low-level datum is considered as logic "0," for example.

While fuse F2 is disconnected, input terminal of inverter INV2 is in a floating status. Because the voltage of said input terminal drops to the ground potential GND due to leakage current of transistor NT2, output terminal of inverter INV2 is kept at the high level, for example, at source voltage $V_{dd}$. Thus, transistor NT2 is turned on, and the input terminal of inverter INV2 is kept at the low level. That is, while fuse F2 is disconnected, bit D2 is kept at the high level. Said high-level datum is considered as logic "1," for example.

The number of the aforementioned local circuits each comprising a fusing circuit, an inverter, and an nMOS transistor in fusing circuit 202 is determined according to the number of bits of control data DAT. Then, control data DAT with a desired number of bits corresponding to the driving capability of a given transistor can be output by disconnecting a specific fuse out of the multiple fuses according to the driving capabilities of the pMOS transistor and the nMOS transistor constituting device 200.

Figure 13:
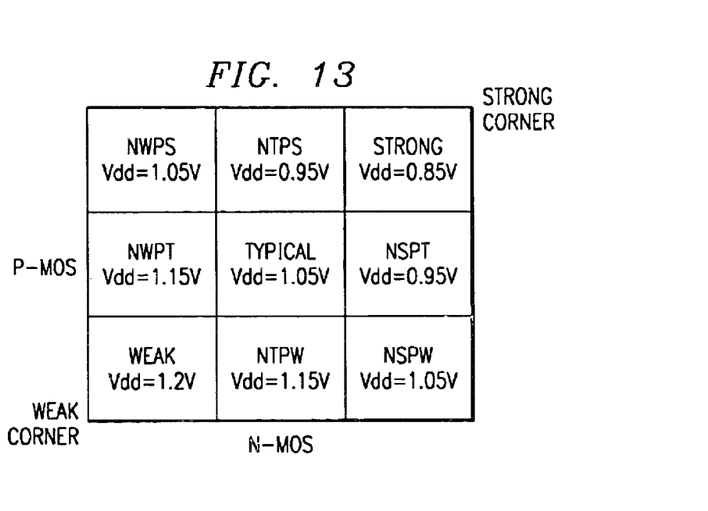
FIG. 13 is a diagram showing the process requirements of the circuit elements and the source voltages under respective process requirements.

FIG. 13 is a diagram showing the grouping of the driving capacity of device 200 according to the driving capabilities of the pMOS transistor and the nMOS transistor constituting device 200 and the levels of source voltage $V_{dd}$ to be supplied to the device in accordance with the respective driving capabilities.

In FIG. 13, Weak indicates a condition in which the driving capabilities of the pMOS transistor and the nMOS transistor constituting device 200 are both weak, Typical indicates that the pMOS transistor and the nMOS transistor both have standard driving capabilities, and Strong indicates that the driving capabilities of the pMOS transistor and the nMOS transistor are both strong. In the other parts, symbols N and P indicate the nMOS transistor and the pMOS transistor, respectively; W indicates Weak, S indicates Strong, and T indicates Typical. That is, NWPS means that the driving capability of the NMOS transistor is weak, and the driving capability of the pMOS transistor is strong.

In FIG. 13, the driving capability of the circuit configured with the nMOS transistor and the pMOS transistor can be divided into 9 conditions by dividing the driving capabilities of the nMOS transistor and the pMOS transistor into 3 stages. These conditions are dependent on the process requirements.

As shown in FIG. 13, the levels of source voltage $V_{dd}$ supplied to device 200 vary under the respective conditions. In the example in FIG. 13, 5 levels of source voltage $V_{dd}$ are needed for the 9 conditions. For example, the source voltage is set to $V_{dd}$=1.2 V while under the Weak condition, to source voltage $V_{dd}$=1.05 V while under the Typical condition, and to source voltage $V_{dd}$=0.85 V while under the Strong condition.

In order to instruct voltage regulator 100 of 5 different levels of source voltage, 3-bit control data DAT are needed. Here, assume, for example, that control data DAT comprise 3 bits of data D2, D1, and D0. After the production process for device 200 is completed, it is measured using a test circuit in order to extrapolate the driving capabilities of the pMOS transistor and the NMOS transistor constituting device 200 according to the result of the measurement, so that the condition of device 200 under the process requirements shown in FIG. 13 can be determined. Because fusing circuit 202 can be programmed to set the respective fuses to desired conditions according to the condition of device 200, control data DAT in accordance with the condition of device 200 are output by fusing circuit 202. Voltage regulator 100 controls the levels of source voltages $V_{dd1}$, $V_{dd2}$, and $V_{dd3}$ supplied to device 200 using predetermined optimum values according to control signal $S_c$ indicating control data DAT and the operating condition of the device.

Figure 14:
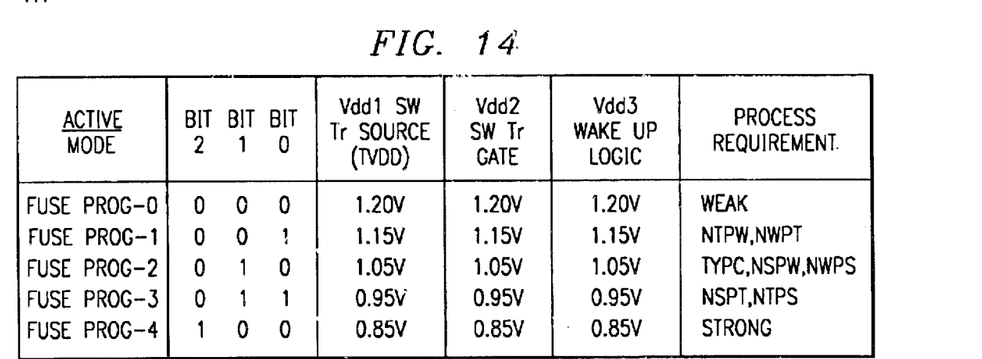
FIG. 14 is a diagram showing the respective bits of control data DAT set in accordance with the process requirements of the device and an example of control voltages during operation.
Figure 15:
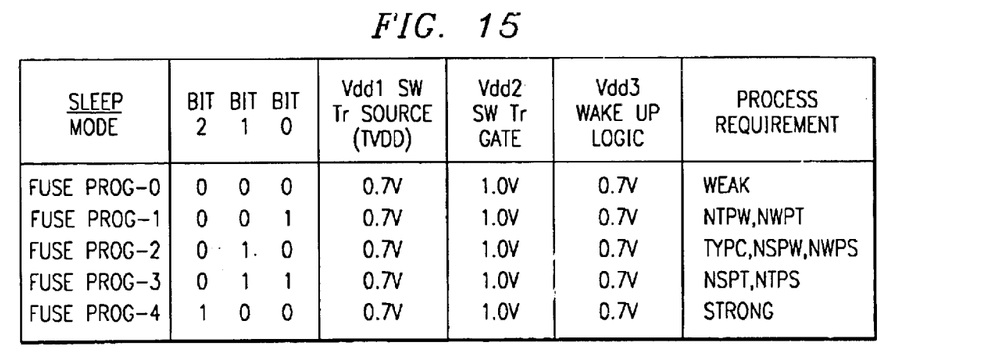
FIG. 15 is a diagram showing the respective bits of control data DAT set in accordance with the process requirements of the device and an example of control voltages during standby.

FIGS. 14 and 15 show the voltage levels of source voltages $V_{dd1}$, $V_{dd2}$, and $V_{dd3}$ generated by voltage regulator 100 according to the values of the respective bits of control data DAT set based on the process requirements of device 200 during operation (Active mode) and during standby (Sleep mode) and said control data.

As shown in the figures, process requirements to which said device belongs is extrapolated according to the driving capability of device 200; fusing circuit 202 is programmed accordingly; and respective bits D2, D1, and D0 of control data DAT are set as a result. Voltage regulator 100 generates different levels of source voltages during operation and during standby according to said control data DAT and status control signal $S_c$ and supplies them to device 200.

Figure 16:
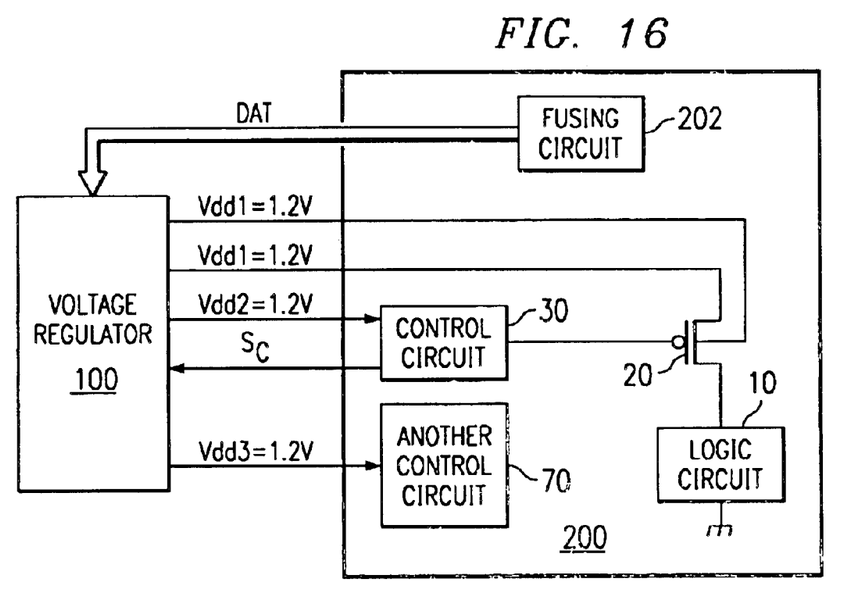
FIG. 16 is a circuit diagram showing the source voltages generated by the voltage regulator and the destinations to which the respective source voltages are supplied during operation.

FIG. 16 is a circuit diagram showing source voltages $V_{dd1}$, $V_{dd2}$, and $V_{dd3}$ generated by voltage regulator 100 during operation and the destinations to which the respective source voltages are supplied.

Here, assuming, for example, that the transistors constituting device 200 are in the "Weak" section under the process requirements, source voltages $V_{dd1}$, $V_{dd2}$, and $V_{dd3}$ generated by voltage regulator 100 during operation are 1.2 V as shown in the figure. Source voltage $V_{dd1}$ is applied respectively to the source and the channel region of pMOS transistor MP0 constituting switching circuit 20 in device 200, source voltage $V_{dd2}$ is applied to control circuit 30, and source voltage $V_{dd3}$ is applied to another control circuit. As a result, switching circuit 20 is turned on during operation, so that driving current $I_D$ is supplied to logic circuit 10.

Figure 17:
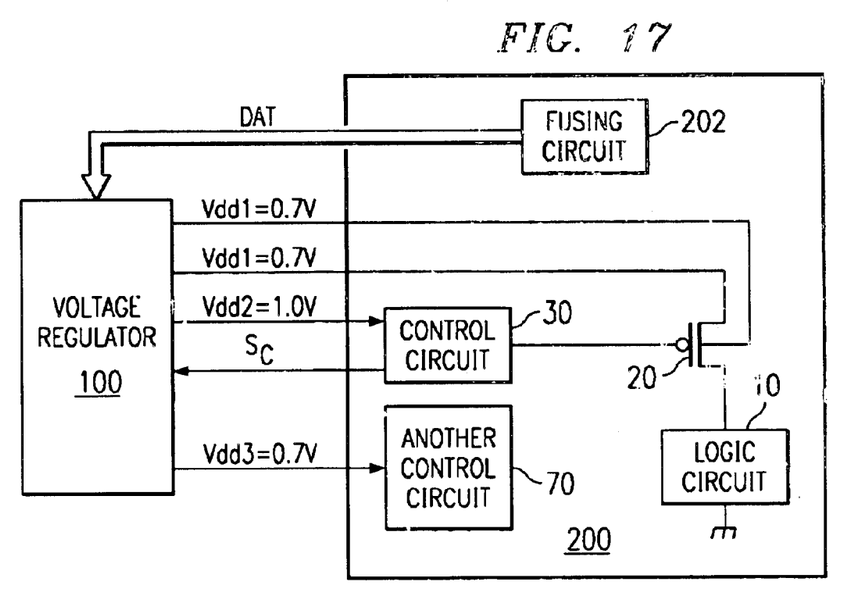
FIG. 17 is a circuit diagram showing the source voltages generated by the voltage regulator and the destinations to which the respective source voltages are supplied during standby.

FIG. 17 is a circuit diagram showing source voltages $V_{dd1}$, $V_{dd2}$, and $V_{dd3}$ generated by voltage regulator 100 during standby and the destinations to which the respective source voltages are supplied.

When device 200 is in the "Weak" section under the process requirements, source voltage $V_{dd1}$ generated by voltage regulator 100 during standby is 0.7 V, source voltage $V_{dd2}$ is 1.0 V, and source voltage $V_{dd3}$ is 0.7 V.

Accordingly, pMOS transistor MP0 constituting switching circuit 20 is in the super cut-off status during standby, and the occurrence of leakage current at logic circuit 10 is suppressed. On the other hand, because 1.0 V source voltage $V_{dd2}$ is supplied to control circuit 30, control circuit 30 is in the operating status, so that it generates control signal $S_c$ as the operating status of device 200 changes and outputs it into voltage regulator 100.

As described above, in the semiconductor integrated circuit of the present embodiment, device 200 is provided with fusing circuit 202, process requirements of device 200 are decided through inspections, the fuses in fusing circuit 202 are disconnected accordingly through programming, and control data DAT in accordance with the process requirements of device 200 is output into voltage regulator 100. Because voltage regulator 100 generates source voltages $V_{dd1}$, $V_{dd2}$, and $V_{dd3}$ using optimum values under the respective preset conditions according to control data DAT and control signal $S_c$ indicating the operating status of device 200, and outputs them into device 200, optimum source voltages in accordance with the process requirements of the circuit elements constituting the device can be supplied, and the effect of variations in the production process can be reduced.

As explained above, in the semiconductor integrated circuit of the present invention, because a switching circuit is provided in the path for supplying the driving current to the logic circuit, the switching circuit can be turned on during operation to supply driving current to the logic circuit, and the switching circuit can be turned off to suppress the occurrence of leakage current in low threshold voltage transistors in the logic circuit. A so-called super cut-off status, in which a voltage equal to or higher than the source voltage is applied to the gate of the pMOS transistor constituting the switching circuit, is achieved during standby, and a bulk bias voltage with the same level as that of the source voltage or a higher level than that of the source voltage is applied to the channel region of the transistor in order to suppress the current to the switching transistor during standby to suppress the occurrence of leakage current.

Furthermore, the gate-source voltage of the switching transistor is set appropriately in order to minimize the drain current.

In addition, as another method for realizing the present invention, the aforementioned switching transistor is used as an nMOS and is configured with a dual circuit, and bias voltage.

In addition, in the present invention, the threshold voltage of the switching transistor is controlled to be low by applying a voltage slightly lower than the source voltage to the channel region of the switching transistor during operation, so that its current driving capability can be improved, and increase in the area for the transistor can be minimized.

Furthermore, the present invention is advantageous in that because a scan-pass circuit is used to control the on/off status of the switching circuit, $I_{ddq}$ can be measured.

In addition, in the present invention, because the process requirements are extrapolated by testing the semiconductor integrated circuit, and the data for setting the optimum source voltages for said process requirements are written into the semiconductor chip, optimum source voltages can be supplied to the circuit elements even when the process requirements involve variations.

What is claimed is:

1. A semiconductor integrated circuit comprising, a functional circuit which performs prescribed processing, a voltage supply circuit which supplies a first source voltage or a second source voltage higher than the first source voltage according to a source voltage control signal, a transistor which is connected between the voltage supply terminal of the voltage supply circuit and the voltage input terminal of the functional circuit in order to control the power supplied to the functional circuit according to a conductivity control signal applied to its gate terminal, and a control circuit which supplies the source voltage control signal and the conductivity control signal; wherein, the voltage supply circuit supplies the first source voltage while the functional circuit is in a standby status, and it supplies the second source voltage while the functional circuit is operating.

2. The semiconductor integrated circuit in claim 1, wherein the transistor is configured with a pMOS transistor, and the voltage level of the conductivity control signal is higher than the source voltage of the first source voltage when the functional circuit is in the standby status.

3. The semiconductor integrated circuit in claim 2, wherein a bias voltage applied to the channel region of the transistor is equal to the first source voltage or higher than the first source voltage when the functional circuit is in the standby status, and the bias voltage is equal to the second source voltage or lower than the second source voltage when the functional circuit is operating.

4. A semiconductor integrated circuit comprising, a functional circuit which performs prescribed processing, a voltage supply circuit which supplies a first source voltage or a second source voltage higher than the first source voltage according to a source voltage control signal, a transistor which is connected between the voltage supply terminal of the voltage supply circuit and the voltage input terminal of the functional circuit in order to control the power supplied to the functional circuit according to a conductivity control signal applied to its gate terminal, and a control circuit which supplies the source voltage control signal and the conductivity control signal; wherein, the voltage supply circuit supplies the second source voltage while the functional circuit is in a standby status, and it supplies the first source voltage while the functional circuit is operating.

5. The semiconductor integrated circuit in claim 4, wherein the transistor is configured with an nMOS transistor, and the voltage level of the conductivity control signal is lower than the source voltage of the second source voltage when the functional circuit is in the standby status.

6. The semiconductor integrated circuit in claim 5, wherein a bias voltage applied to the channel region of the transistor is equal to the second source voltage or lower than the second source voltage when the functional circuit is in the standby status, and the bias voltage is equal to the first source voltage or higher than the first source voltage when the functional circuit is operating.

7. A semiconductor integrated circuit comprising, a functional circuit containing an nMOS transistor and a pMOS transistor which performs prescribed processing, a data generating circuit which generates control data corresponding to the driving capabilities of the transistors in the functional circuit, a voltage supply circuit which supplies source voltages of different voltage values according to the control data, and a transistor which is connected between the voltage supply terminal of the voltage supply circuit and the voltage input terminal of the functional circuit in order to supply a voltage to the functional circuit according to a conductivity control signal applied to its gate terminal.

8. The semiconductor integrated circuit in claim 7, wherein the data generating circuit is provided with a fuse circuit used for setting the control data.

* * * * *